(12) United States Patent
Schicktanz et al.

(10) Patent No.: US 10,181,586 B2
(45) Date of Patent: Jan. 15, 2019

(54) ORGANIC LIGHT-EMITTING DEVICE

(71) Applicant: OSRAM OLED GmbH, Regensburg (DE)

(72) Inventors: Simon Schicktanz, Regensburg (DE); Philipp Schwamb, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/543,226

(22) PCT Filed: Dec. 22, 2015

(86) PCT No.: PCT/EP2015/081076
§ 371 (c)(1),
(2) Date: Jul. 12, 2017

(87) PCT Pub. No.: WO2016/113097
PCT Pub. Date: Jul. 21, 2016

(65) Prior Publication Data
US 2018/0006262 A1    Jan. 4, 2018

(30) Foreign Application Priority Data

Jan. 13, 2015 (DE) .................. 10 2015 100 411
Apr. 10, 2015 (DE) .................. 10 2015 105 484

(51) Int. Cl.
*H01L 51/52* (2006.01)

(52) U.S. Cl.
CPC ........ *H01L 51/529* (2013.01); *H01L 51/5215* (2013.01); *H01L 51/5234* (2013.01); *H01L 51/5253* (2013.01); *H01L 2251/5323* (2013.01)

(58) Field of Classification Search
None
See application file for complete search history.

(56) References Cited

U.S. PATENT DOCUMENTS

| | | | |
|---|---|---|---|
| 8,829,556 B2 * | 9/2014 | Aurongzeb | H01L 51/529 257/99 |
| 2004/0032209 A1 | 2/2004 | Wu et al. | |
| 2004/0178722 A1 | 9/2004 | Cok et al. | |
| 2005/0285519 A1 | 12/2005 | Cok | |
| 2014/0374726 A1 * | 12/2014 | Goeoetz | H01L 51/529 257/40 |

FOREIGN PATENT DOCUMENTS

| | | |
|---|---|---|
| JP | 2000268980 A | 9/2000 |
| JP | 2001237063 A | 8/2001 |
| WO | 2011030283 A2 | 3/2011 |

* cited by examiner

*Primary Examiner* — Bradley K Smith
(74) *Attorney, Agent, or Firm* — McDermott Will & Emery LLP

(57) ABSTRACT

The invention relates to an organic light-emitting component which has an organic functional layer stack (3) having at least one light-emitting layer, which is designed to generate light during operation of the component, a transparent first electrode (2) and a transparent second electrode (4), which are designed to inject charge carriers into the organic functional layer stack (3) during operation, and a heat distribution layer (9), which is applied over the electrodes (2, 4) and the organic functional layer stack (3) and which has at least one plastic layer (10) and a highly heat conductive layer (11), wherein the heat distribution layer (9) has at least one transparent sub-region (91) and at least one non-transparent sub-region (92).

20 Claims, 2 Drawing Sheets

ORGANIC LIGHT-EMITTING DEVICE

Figure 1A:
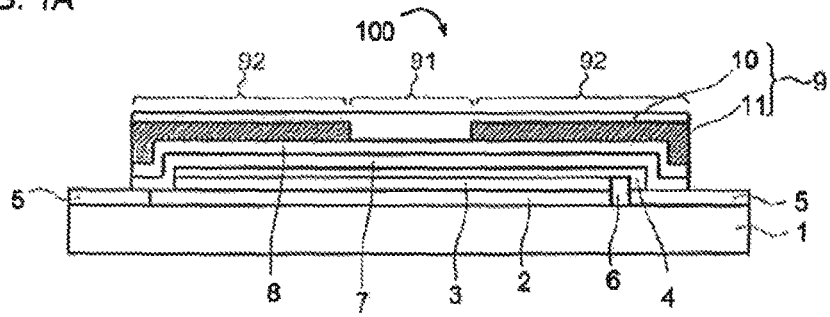

An organic light-emitting device and a method for producing an organic light-emitting device are provided.

The present patent application claims priority from German patent applications 10 2015 100 411.9 and 10 2015 105 484.1, the disclosure content of which is hereby included by reference.

Organic light-emitting diodes are used for a multiplicity of lighting devices, wherein the organic light-emitting diodes have to be purposefully adapted to the respective requirements. In order for example to achieve the necessary heat distribution in automotive applications, it is known to apply a heat distribution structure, also known as a heat spreader, to an organic light-emitting diode. A non-transparent aluminum foil is conventionally used for this purpose. If such a foil is adhesively bonded over the light-emitting surface flush with the edge of the organic light-emitting diode, a barrier action may also be achieved thereby in addition to the heat distribution function, said barrier action bringing about an additional time delay, also known as "lag time", in respect of moisture penetrating laterally into such a component.

In particular in automotive applications, it may however be desired, for example for design reasons, for organic light-emitting diodes used for this purpose to comprise transparent surface regions, in particular transparent, non-illuminating surface regions, in addition to the light-emitting surfaces. In this respect it is known to use patterned heat-distribution foils set back from the component edge, whereby the described additional barrier action can, however, no longer be achieved.

As an alternative, it is known to laminate a transparent glass cover onto an organic light-emitting diode, which glass cover terminates with the component edge. A thermally conductive foil is laminated onto the glass cover, so resulting, however, in elevated material and processing costs.

It is at least one object of specific embodiments to provide an organic light-emitting device with a heat distribution element.

This object is achieved by a subject matter according to the independent claim. Advantageous embodiments and further developments of the subject matter are identified in the dependent claims and are revealed, moreover, by the following description and drawings.

According to at least one embodiment, an organic light-emitting device comprises an organic functional layer stack containing at least one organic light-emitting layer which is configured to generate light when the device is in operation. Furthermore, the device comprises a first electrode and a second electrode, which are configured to inject charge carriers into the functional layer stack when in operation. In particular, one of the electrodes may take the form of an anode and the other one of the electrodes may take the form of a cathode, which when in operation each respectively inject holes or electrons, in particular from different sides, into the at least one organic light-emitting layer. By recombining holes and electrons, light may be generated in the light-emitting layer by electroluminescence. The organic light-emitting device may thus in particular take the form of an organic light-emitting diode (OLED), in which the organic functional layer stack is arranged between the first and second electrodes. The first and second electrodes are each transparent, such that light generated when the organic light-emitting device is in operation may be emitted by both the first electrode and the second electrode. When switched off, the layer stack formed of the electrodes and the organic functional layer stack accordingly appears to be transparent.

"Transparent" here and hereinafter means a layer which may also be a sequence of layers and which is transmissive to visible light, in particular to light which is generated in the light-emitting layer when the device is in operation. A transparent layer may be clear or also at least partially light-diffusing and/or partially light absorbing, such that a layer designated as transparent may for example also be diffusely transmissive or milky and thus translucent.

According to one further embodiment, the organic light-emitting device comprises a heat distribution layer, which is applied over the electrodes and the organic functional layer stack. The heat distribution layer may in particular be provided and configured to distribute heat generated during operation of the organic functional layer stack, such that the organic functional layer stack has maximally homogeneous heat distribution. Homogeneous heat distribution may in particular be advantageous where the light emitted locally by the organic functional layer stack when in operation, i.e. for example the brightness and/or color thereof, is dependent on the local temperature. The heat distribution layer may in particular form a cover layer which is arranged over the electrodes and the organic functional layer stack and with which the organic light-emitting device terminates on one side.

According to one further embodiment, the heat distribution layer comprises at least one transparent sub-region and at least one non-transparent sub-region. Since the other layers of the organic light-emitting device are preferably at least partially or wholly transparent, the appearance of the organic light-emitting device may be determined with regard to its transparency in the off state by way of the heat distribution layer. For instance, the at least one transparent sub-region and the at least one non-transparent sub-region of the heat distribution layer may predetermine in which regions the organic light-emitting device appears transparent in the off state and in which regions the device has a non-transparent effect.

For example, the heat distribution layer may comprise a transparent sub-region in an edge region, such that the organic light-emitting device is transparent in the edge region. "Edge region" here and hereinafter denotes a region of the organic light-emitting device which extends as far as the edge of the device. This means in particular an edge which delimits the organic light-emitting device in a lateral direction, wherein "lateral direction" denotes a direction which extends along a main direction of extension of the organic light-emitting device. Main directions of extension are here directions in the main plane of extension of the organic light-emitting device, i.e. in that plane in which the organic light-emitting device has its greatest dimensions.

The organic light-emitting device may in particular be two-dimensional, i.e. have a significantly greater extent in directions perpendicular to the direction of arrangement of the electrodes and of the organic functional layer stack than in a direction along the direction of arrangement of the electrons of the organic functional layer stack. Accordingly, layers and elements of the organic light-emitting device have main surfaces which are parallel to the main plane of extension of the device. "Main surfaces" are thus those surfaces of the layers or elements of the organic light-emitting device which extend along the main plane of extension of the organic light-emitting device. In respect of the direction of arrangement of the electrodes and of the organic functional layer stack, the main surfaces of the layers or elements of the organic light-emitting device are thus formed by the tops and bottoms of the individual layers or elements. In other words, the individual layers or elements of the organic light-emitting device are applied with their respective main surfaces against one another.

It may furthermore also be possible for the heat distribution layer to comprise a transparent sub-region in a central region, such that the organic light-emitting device is transparent in a central region. A central region is here and hereinafter a region which does not adjoin an edge of the organic light-emitting device, such that a transparent central region is separated by a non-transparent region of the heat distribution layer from each edge of the organic light-emitting device.

According to one further embodiment, the heat distribution layer comprises at least one plastics layer and at least one further layer which is formed from a material with a higher thermal conductivity than the plastics layer. In particular, taking account of the thermal conductivity of the plastics layer, the further layer with the higher thermal conductivity than the plastics layer may for example have a thermal conductivity of greater than or equal to 1 W/(m·K) or greater than or equal to 10 W/(m·K) or greater than or equal to 100 W/(m·K). The further layer may also be designated a highly thermally conductive layer, wherein the term "highly thermally conductive" relates to the above information. Particularly preferably, the highly thermally conductive layer may comprise a metal layer or be formed by a metal layer.

The highly thermally conductive layer, in particular for example a metal layer, may in particular be non-transparent, while the plastics layer is transparent. The heat distribution layer may in particular be a laminate formed of or with the at least one plastics layer and the at least one highly thermally conductive layer. The plastics layer and the highly thermally conductive layer are preferably arranged at least in part laterally next to one another in the heat distribution layer. By arranging the plastics layer and the highly thermally conductive layer as parts of the heat conduction layer, transparent and non-transparent sub-regions of the heat distribution layer may thus be determined. For example, the highly thermally conductive layer may comprise a clearance in the at least one transparent sub-region of the heat distribution layer, such that in the at least one transparent sub-region only the plastics layer is present. A clearance may here be formed in that the highly thermally conductive layer is set back from an edge of the heat distribution layer, such that the corresponding edge of the heat distribution layer is formed by the plastics layer. Furthermore, a clearance may also be formed by an opening in the highly thermally conductive layer, such that the plastics layer is arranged in the opening of the highly thermally conductive layer. Furthermore, it may also be possible for the highly thermally conductive layer to be present in mutually isolated sub-regions within the heat distribution layer and for the mutually isolated sub-regions to be connected together by sub-regions of the plastics layer.

To produce the organic light-emitting device, the first and second electrodes and the organic functional layer stack may be provided in the form of a layer sequence. The heat distribution layer may be applied thereover. To produce the heat distribution layer, a plastics film may for example be provided, which forms the at least one plastics layer of the heat distribution layer and into which the highly thermally conductive layer, for example a metal layer, is impressed. The highly thermally conductive layer may here consist of a contiguous part or indeed of mutually isolated layer parts. Alternatively, it may also be possible to produce the heat distribution layer by extruding a plastics material on or around a patterned film or foil, for example a metal foil. The patterned film/foil, which may for example be a grid which may be simply produced and processed, then forms the highly thermally conductive layer of the heat distribution layer. It is furthermore also possible to process a plastics material in patterned manner with a suitable material for the highly thermally conductive layer, for example a metal material, by coextrusion with the heat distribution layer.

According to one further embodiment, the highly thermally conductive layer in the finished heat distribution layer is free of the plastics layer on at least one main surface. This means in other words that the highly thermally conductive layer is not covered with the plastics layer on at least one main surface. This may for example be achieved in that the highly thermally conductive layer is impressed into the plastics layer or in that the material of the plastics layer is extruded on one side onto the highly thermally conductive layer. For example, the highly thermally conductive layer is free of the plastics layer on precisely one side. In this case, one of the main surfaces of the heat distribution layer is formed by sub-regions of the highly thermally conductive layer and sub-regions of the plastics layer, while the other main surface of the heat distribution layer is formed only by the plastics layer.

According to one further embodiment, the highly thermally conductive layer is free of the plastics layer on both main surfaces. This means, in other words, that the heat distribution layer comprises regions arranged laterally next to one another which are formed either by a respective sub-region of the highly thermally conductive layer or a respective sub-region of the plastics layer. The main surfaces of the heat distribution layer are thus formed on both sides by surfaces of the highly thermally conductive layer and of the plastics layer.

According to one further embodiment, the plastics layer completely encloses the highly thermally conductive layer. This may mean in particular that the highly thermally conductive layer is covered on both main surfaces with the plastics layer, such that the plastics layer forms the main surfaces of the heat distribution layer. Furthermore, this may mean that the highly thermally conductive layer is completely embedded in the plastics layer and thus surrounded by the plastics layer. The heat distribution layer may to this end be produced for example by bilateral extrusion of the material of the plastics layer onto the highly thermally conductive layer, in particular for example onto a metal layer.

According to one further embodiment, the organic light-emitting device comprises an encapsulation arrangement. The encapsulation arrangement may in particular be arranged over the electrodes and the organic functional layer stack. The encapsulation arrangement is suitable for protecting the organic functional layer stack and the electrodes from harmful substances in the surrounding environment, for example moisture, oxygen and/or hydrogen sulfide. The encapsulation arrangement may in particular be transparent, such that light generated in the organic functional layer stack when in operation may be radiated through the encapsulation arrangement.

The heat distribution layer may preferably be applied to the encapsulation arrangement. To this end, the heat distribution layer may be applied with a bonding layer, in particular a transparent bonding layer, to the encapsulation arrangement, wherein the bonding layer is particularly preferably in direct contact with the encapsulation arrangement and the heat distribution layer. The bonding layer may preferably take the form of an adhesive layer. For example, an optically clear adhesive (OCA) may be used for this purpose, in particular a transparent pressure sensitive adhesive (PSA).

Furthermore, the organic light-emitting device may comprise a substrate, on which the electrodes, the functional layer stack and the encapsulation arrangement are arranged. In particular, the first electrode may be arranged on the substrate, with the organic functional layer stack thereover, the second electrode thereover and the encapsulation arrangement thereover. The heat distribution layer may accordingly be arranged in particular over the encapsulation arrangement and thus on the opposite side of the organic light-emitting device from the substrate.

According to one further embodiment, the encapsulation arrangement takes the form of a thin-film encapsulation. An encapsulation arrangement configured as a thin-film encapsulation is here understood to mean a device which is suitable for forming a barrier against atmospheric substances, in particular against moisture and oxygen and/or against further harmful substances such as for instance corrosive gases, for example hydrogen sulfide. In other words, the thin-film encapsulation is configured such that penetration thereof by atmospheric substances is not possible at all or at most in very small proportions. During thin-film encapsulation, this barrier action is caused substantially by encapsulation layers embodied as one or more thin layers, which layers are part of the encapsulation arrangement or form the encapsulation arrangement. The encapsulation layers of the encapsulation arrangement generally have a thickness of less than or equal to a few 100 nm. The encapsulation arrangement preferably comprises a layer sequence with a plurality of the thin encapsulation layers, which may each have a thickness of greater than or equal to one atomic layer or greater than or equal to 1 nm or greater than or equal to 5 nm and less than or equal to 500 nm or less than or equal to 200 nm or less than or equal to 100 nm or less than or equal to 70 nm or less than or equal to 50 nm or less than or equal to 20 nm or less than or equal to 10 nm.

The encapsulation layers may be applied for example by means of atomic layer deposition (ALD) or molecular layer deposition (MLD). Suitable encapsulation materials for the encapsulation layers of the encapsulation arrangement are oxides, nitrides or oxynitrides, for example aluminum oxide, zinc oxide, zirconium oxide, titanium oxide, hafnium oxide, lanthanum oxide or tantalum oxide.

As an alternative or in addition to encapsulation layers produced by ALD or MLD, the encapsulation arrangement may comprise at least one or a plurality of further layers, thus in particular barrier layers and/or passivation layers, which are deposited by thermal vapor deposition, by means of a plasma-assisted process, for instance sputtering or plasma-enhanced chemical vapor deposition (PECVD), or by means of plasma-less vapor deposition such as for instance chemical vapor deposition (CVD). Suitable materials therefor may be the materials stated above in connection with ALD and MLS, as well as silicon nitride, silicon oxide, silicon oxynitride, indium-tin oxide, indium-zinc oxide, aluminum-doped zinc oxide and mixtures and alloys of the stated materials. The one or the plurality of further layers may for example each have a thickness of between 1 nm and 5 µm and preferably between 200 nm and 2 µm, limit values included.

To produce the organic light-emitting device, a large-area composite may for example be provided, which comprises a plurality of units which, after singulation, are each parts of organic light-emitting devices. In particular, each of the mutually connected units may comprise an organic functional layer stack with the first and second electrodes, which are provided on a common substrate for the composite. On the electrodes and the organic functional layer stack an encapsulation arrangement may be applied extending extensively over the units, onto which encapsulation arrangement a composite consisting of a multiplicity of heat distribution layers is laminated. The composite consisting of the multiplicity of heat distribution layers may in particular be formed by a film/foil produced using the above-described production methods. After application of the heat distribution multilayer composite, dicing into individual organic light-emitting devices may be performed. To expose contact regions in the individual units, sub-regions of the heat distribution layer and of the encapsulation arrangement may be removed. Alternatively, it may also be possible to apply a heat distribution layer to an already singulated layer sequence provided with an encapsulation arrangement and having the electrodes and the organic functional layer stack, wherein said heat distribution layer may already have the desired shape, such that after application of the heat distribution layer contact faces of the organic light-emitting device are already exposed without further patterning measures. The heat distribution layer may accordingly extend in at least one sub-region up to the edge of the organic light-emitting device. Furthermore, it may also be possible that the heat distribution layer is set back from an edge of the organic light-emitting device, such that the organic light-emitting device comprises an edge region which is free of the heat distribution layer.

According to a further embodiment, the heat distribution layer is embodied such that, regardless of the different regions of the organic light-emitting device to which the heat distribution layer is applied, no different height levels or variations in thickness and morphologies any longer arise. For example, the highly thermally conductive layer may to this end, as described further above, be surrounded at least on one side or indeed completely by the plastics layer. Alternatively, only a lateral connection may exist between regions of the highly thermally conductive layer and the plastics layer, such that the highly thermally conductive layer is free of the plastics layer on both main surfaces.

According to one further embodiment, the heat distribution layer comprises a transparent barrier layer on at least one main surface. The transparent barrier layer may here preferably be applied at least directly to the plastics layer. In this way, it is possible to ensure that even in those regions which are formed only by the plastics layer the heat distribution layer has a high level of impermeability relative to harmful substances from the surrounding environment, for example a tightness relative to water diffusion, which may be stated as water vapor transmission rate (WVTR), of less than or equal to $10^{-3}$ g/(m$^2$·day) or less than or equal to $10^{-5}$ g/(m$^2$·day) or less than or equal to $10^{-6}$ g/(m$^2$·day). Furthermore, the barrier layer may completely cover the at least one main surface, such that the barrier layer may be applied extensively on the heat distribution layer. The barrier layer may thus extend at least in part also over the highly thermally conductive layer. The barrier layer is preferably arranged on the side of the heat distribution layer facing the organic functional layer stack.

According to one further embodiment, the barrier layer comprises at least one oxide, nitride or oxynitride, in particular one of the materials mentioned above in connection with the encapsulation arrangement. The barrier layer, which may also comprise a plurality of individual layers, may accordingly be produced by means of one or more of the methods described above in connection with the encapsulation arrangement. The barrier layer may thus particularly preferably take the form of a thin-film encapsulation layer or of a corresponding layer sequence in the form of a thin-film encapsulation. In the finished device, the organic light-emitting device may thus for example comprise on the electrons and the organic functional layer stack the encapsulation arrangement, directly thereon the bonding layer, directly thereon the barrier layer of the heat distribution layer and directly thereon the plastics layer and/or the highly thermally conductive layer of the heat distribution layer.

According to one further embodiment, the plastics layer of the heat distribution layer comprises a material which has a lower thermal conductivity than the highly thermally conductive layer. In particular, the plastics layer may comprise a transparent material.

The plastics layer may for example comprise siloxanes, epoxides, acrylates, methyl methacrylates, imides, carbonates, olefins, styrenes, urethanes or derivatives thereof in the form of monomers, oligomers or polymers and furthermore also mixtures, copolymers or compounds therewith. For example, the plastics layer may include or be an epoxy resin, polymethyl methacrylate (PMMA), polystyrene, polycarbonate, polyacrylate, polyurethane or a silicone resin such as for instance polysiloxane or mixtures thereof.

Furthermore, the plastics layer may comprise additives, for example for improving thermal conductivity. To this end, the plastics layer may in particular contain carbon particles, which are admixed with a plastics material.

The highly thermally conductive layer may for example comprise or consist of aluminum and/or copper. In particular, the sublayer may be configured in such a way that it is hermetically impermeable to harmful gases from the surrounding environment.

For heat distribution purposes, the organic light-emitting device described here comprises a combined film, formed by the heat distribution layer, which comprises or consists of a highly thermally conductive layer, in particular for example a metal layer, and a plastics layer. The heat distribution layer may here in particular comprise non-transparent, hermetically impermeable layer regions which may preferably come to lie over the light-emitting face and component metallizations of the organic light-emitting device, in order to make the heat distribution in the organic light-emitting device homogeneous. Furthermore, the heat distribution layer comprises transparent regions formed by plastics layer regions, which come to lie on those regions of the organic light-emitting device which are intended to remain transparent when the organic light-emitting device is in the off state. In order to achieve a maximally hermetically impermeable barrier also in these regions relative to harmful environmental influences, an additional barrier layer may be applied at least to the plastics layer regions and preferably to the entire heat distribution layer, such that the entirety of the heat distribution layer may be hermetically impermeable at least perpendicular to the main surfaces thereof. An inexpensive embodiment of a cover layer of an organic light-emitting device is thereby possible which provides both heat distribution and a barrier action with simultaneous transparency in desired regions and in the process requires slight design restrictions for example for automotive applications, for example transparent regions at the edge or within the light-emitting face.

Figure 1B:
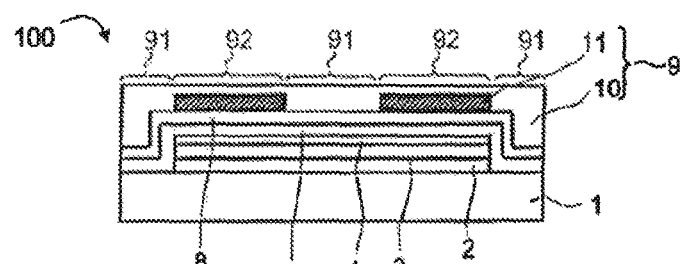
Figure 1C:
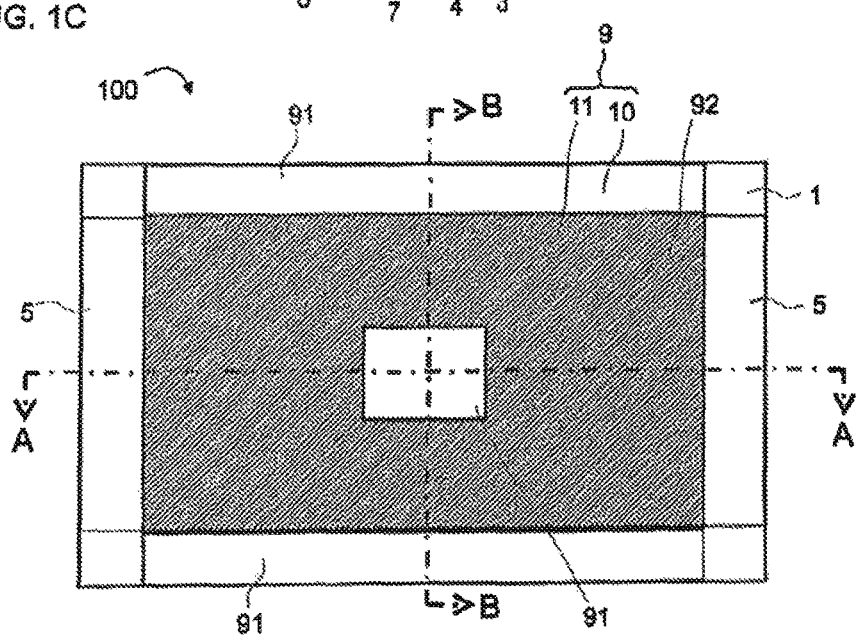
Figure 1D:
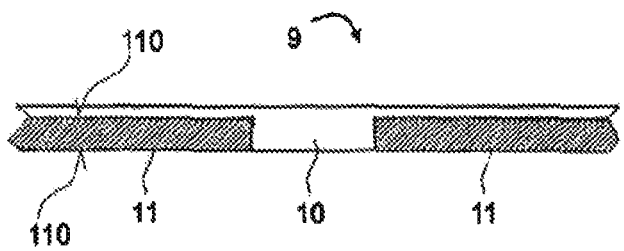
Figure 2:
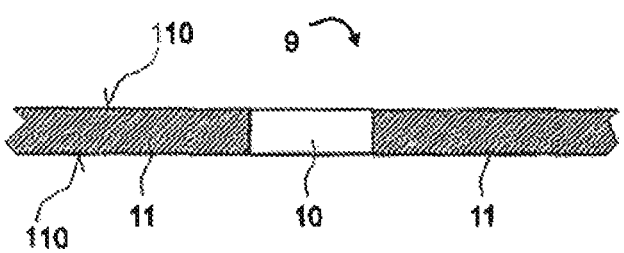
Figure 3:
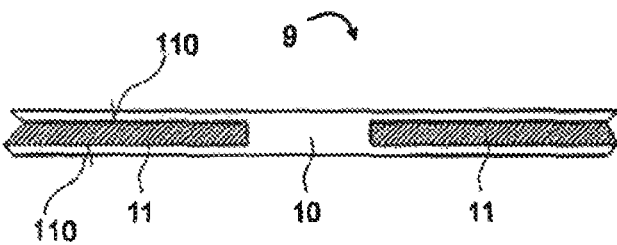
Figure 4:
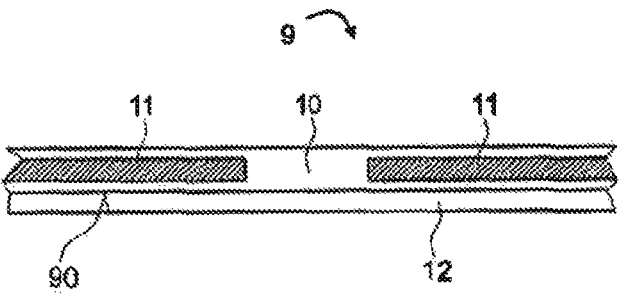

Further advantages, advantageous embodiments and further developments are revealed by the exemplary embodiments described below in connection with the figures, in which:

FIGS. 1A to 1D are schematic representations of different views of an organic light-emitting device and a heat distribution layer according to an exemplary embodiment and FIGS. 2 to 4 are schematic representations of heat distribution layers according to further exemplary embodiments.

In the exemplary embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

FIGS. 1A to 1C show an exemplary embodiment of an organic light-emitting device 100 which takes the form of an organic light-emitting diode (OLED). In this respect, FIGS. 1A and 1B show sectional representations of the device 100 along the section planes AA and BB shown in FIG. 1C, wherein FIG. 1C shows a plan view onto the device 100. FIG. 1D shows a portion of the heat distribution layer 9 of the device 100 shown in FIGS. 1A to 1C. The description below relates equally to FIGS. 1A to 1D.

The organic light-emitting device 100 comprises a substrate 1 on which an organic functional layer stack 3 with at least one light-emitting layer is arranged between a first electrode 2 and a second electrode 4, such that when the device 100 is in operation light is generated in the organic functional layer stack 3. The substrate and the first and second electrodes 2, 4 are transparent, such that, when in operation, the organic light-emitting device 100 may emit light through the first electrode 2 and the substrate 1 and also through the second electrode 4.

The substrate 1 is embodied for example in the form of a glass sheet or glass layer. Alternatively, the substrate 1 may also for example comprise a transparent plastics material or a glass/plastics laminate. The substrate 1 may optionally be encapsulated with an encapsulation arrangement which may be arranged between the substrate 1 and the first electrode 2 and/or on the side of the substrate 1 remote from the first electrode 2.

At least one of the transparent electrodes 2, 4 may for example comprise a transparent conductive oxide. Transparent conductive oxides (TCO) are transparent, conductive materials, generally metal oxides, such as for example zinc oxide, tin oxide, cadmium oxide, titanium oxide, indium oxide and indium tin oxide (ITO). In addition to binary metal-oxygen compounds, such as for example ZnO, $SnO_2$ or $In_2O_3$, ternary metal-oxygen compounds, such as for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, TCOs do not necessarily correspond to a stoichiometric composition and may also be p- or n-doped.

The wider of the transparent electrodes 2, 4 may for example comprise a metal, which may be selected from aluminum, barium, indium, silver, gold, magnesium, calcium and lithium and compounds, combinations and alloys therewith and which has a sufficiently small thickness to be light-transmitting.

Alternatively or in addition, both electrodes 2, 4 may also comprise a TCO material. Furthermore, metallic network structures, conductive networks and metallic meshes, for example with or of silver, and/or graphene, as well as carbon-containing layers, are conceivable. Furthermore, one or both electrodes 2, 4 may comprise a layer stack having at least one TCO and at least one metal and/or one of the further stated materials. The lower electrode 2 is configured in the exemplary embodiment shown as an anode, while the upper electrode 4 is configured as a cathode. With a corresponding material selection, however, a polarity-reversed structure is also possible.

The electrodes 2, 4 are preferably large-area and contiguous, such that the OLED 100 may take the form of a light source, in particular an area light source. "Large-area" may mean that the organic light-emitting element 100 comprises an area of greater than or equal to a few square millimeters, preferably greater than or equal to one square centimeter and particularly preferably greater than or equal to one square decimeter. Alternatively, it may to this end also be possible for at least one of the electrodes 2, 4 of the light-emitting device 100 to be patterned, so enabling by means of the light emitting device 100 a spatially and/or chronologically patterned and/or variable light appearance, for example for patterned and/or polychrome lighting or for a display device.

For electrical contacting of the electrodes 2, 4 it is possible, as shown in FIG. 1, for electrode terminal pieces 5 to be provided, which extend outwards from the electrodes 2, 4 through under the encapsulation arrangement 7 described further below. The electrode terminal pieces 5 configured as electrical contact feeders may be transparent or non-transparent and for example comprise or consist of a TCO and/or a metal.

The organic functional layer stack 3 may comprise layers with organic polymers, organic oligomers, organic monomers, organic small, non-polymeric molecules ("small molecules") or combinations thereof. It may in particular be advantageous for the organic functional layer stack to comprise a functional layer which takes the form of a hole-transport layer, in order to allow effective hole injection into the light-emitting layer. Materials which may prove advantageous for a hole transport layer are for example tertiary amines, carbazole derivatives, conductive polyaniline or polyethylene dioxythiophene. Materials suitable as materials for the light-emitting layer are materials which have radiation emission based on fluorescence or phosphorescence, for example polyfluorene, polythiophene or polyphenylene, or derivatives, compounds, mixtures or copolymers thereof. Furthermore, the organic functional layer stack 3 may comprise a functional layer which takes the form of an electron-transport layer. Furthermore, the organic functional layer stack 3 may also comprise electron- and/or hole-blocking layers. The organic functional layer stack may also comprise a plurality of organic light-emitting layers arranged between the electrodes.

Furthermore, as shown in FIG. 1, insulator layers 6, for example with or of polyimide, may be present which may for example electrically insulate the electrodes 2, 4 from one another. Depending on the configuration of the individual layers of the organic light-emitting device 100, insulator layers 6 are also not absolutely essential and may be absent, for instance in corresponding mask processes for layer application.

An encapsulation arrangement 7 is arranged over the organic functional layer stack 3 and the electrodes 2, 4 to protect the organic functional layer stack 3 and the electrodes 2, 4. The encapsulation arrangement 7 is here particularly preferably embodied as a transparent thin-film encapsulation which comprises at least one or a plurality of encapsulation layers of one or more transparent encapsulation materials. The encapsulation layers may for example be applied by means of ALD or MLD methods. Suitable materials for the layers of the encapsulation arrangement 7, which may preferably have a thickness of greater than or equal to one atomic layer and less than or equal to 500 nm, are for example aluminum oxide, zinc oxide, zirconium oxide, titanium oxide, hafnium oxide, lanthanum oxide or tantalum oxide. As an alternative or in addition to encapsulation layers produced by ALD or MLD, the encapsulation arrangement 7 may comprise at least one or a plurality of further layers, i.e. in particular barrier layers and/or passivation layers, which may be applied by other methods described above in the general part.

A heat distribution layer 9 is additionally applied over the electrodes 2, 4 and the organic functional layer stack 3, which heat distribution layer comprises at least one plastics layer 10 and one highly thermally conductive layer 11, wherein the heat distribution layer 9 comprises at least one transparent sub-region 91 and at least one non-transparent sub-region 92. The heat distribution layer 9 thus forms a cover layer over the organic functional layer stack 3 and the electrodes 2, 4 and extends at least in sub-regions as far as the edge of the organic light-emitting device 100. The heat distribution layer 9 is set back over the electrode terminal pieces 5 in the edge region of the organic light-emitting device 100, such that the electrode terminal pieces 5 are exposed for external contacting.

The heat distribution layer 9 is applied to the layers therebelow by means of a bonding layer 8. The bonding layer 8 may in particular be formed by a transparent adhesive layer such as for example a transparent pressure sensitive adhesive. This makes it possible to laminate the heat distribution layer 9 simply onto the layer stack therebelow.

The heat distribution layer 9 is transparent in the edge regions, which extend as far as the edge of the organic light-emitting device 100, and in a central region. In the corresponding transparent sub-regions 91, the heat distribution layer 9 merely comprises the plastics layer 10. The non-transparent sub-region 92 of the heat distribution layer 9 is formed by that region of the heat distribution layer 9 in which the highly thermally conductive layer 11 is arranged. The plastics layer 10 and the highly thermally conductive layer 11 are thus arranged at least in part laterally next to one another in the heat distribution layer.

The highly thermally conductive layer 11, which comprises a non-transparent and preferably hermetically impermeable material with high thermal conductivity, for example greater than or equal to 10 W/(m·K) or greater than or equal to 100 W/(m·K), may preferably be formed with or of a metal such as aluminum and/or copper and within the heat distribution layer 9 does not extend up to the edge of the organic light-emitting device 100. Furthermore, in a central region the highly thermally conductive layer 11 comprises a clearance in the form of an opening. As a result of the configuration illustrated of the highly thermally conductive layer 11 within the heat distribution layer 9 and the arrangement of the heat distribution layer 9 on the layers therebelow, it is thus possible for the organic light-emitting device 100 to be transparent in a peripheral edge region and in a central region. As an alternative to the transparent and non-transparent sub-regions 91, 92 shown, the latter may also be differently configured with regard to position and shape.

The heat distribution layer 9 obtains its desired heat distribution properties as a result of the highly thermally conductive layer 11, such that homogeneous heat distribution may be achieved within the organic functional layer stack 3 during operation of the organic light-emitting device 100. At the same time, the highly thermally conductive layer 11 brings about an additional barrier action over the light-emitting face of the organic light-emitting device 100.

The plastics layer 10 may comprise a plastics material mentioned above in the general part. To improve the thermal conductivity of the material of the plastics layer 10, an additive may be admixed thereto, for example in the form of carbon particles.

As is visible in particular in FIG. 1D, the highly thermally conductive layer 11, which comprises two main surfaces 110, is free of the plastics layer 10 on one of the main surfaces 110. To produce the heat distribution layer 9, the highly thermally conductive layer 11 may for example be provided in the form of a patterned film/foil such as for instance a metal foil, onto one side of which the material of the plastics layer 10 is extruded. It may furthermore also be possible that for example the plastics layer 10 is provided as a prefabricated plastics film, into which the highly thermally conductive layer 11 is then impressed.

The heat distribution layer 9 may, as is visible in particular from FIGS. 1A and 1B, be embodied such that no different height levels or variations in thickness and morphologies arise in the finished organic light-emitting device 100.

FIGS. 2 to 4 show further exemplary embodiments of the heat distribution layer 9 which may be used instead of the heat distribution layer 9 described in connection with FIGS. 1A to 1D for the organic light-emitting device 100.

In comparison to the heat distribution layer 9 shown in FIG. 1D, in which the plastics layer 10 forms one of the main surfaces of the heat distribution layer 9, while the other main surface of the heat distribution layer 9 is formed by the regions of the plastics layer and the regions of the highly thermally conductive layer 11, FIG. 2 shows a heat distribution layer 9 in which both main surfaces 110 of the highly thermally conductive layer 11 are free of the plastics layer 10. Thus, between the regions of the plastics layer 10 and the regions of the highly thermally conductive layer 11 there is only one lateral connection, while the main surfaces of the heat distribution layer 9 are formed both by the regions of the plastics layer 10 and also by the regions of the highly thermally conductive layer 11.

FIG. 3 shows a further exemplary embodiment of a heat distribution layer 9 in which both main surfaces 110 of the highly thermally conductive layer 11 are covered by the plastics layer 10. In this way, the highly thermally conductive layer 11 is completely enclosed by the plastics layer 10, such that the plastics layer 10 forms the main surfaces of the heat distribution layer 9. Production of the heat distribution layer shown in FIG. 3 may for example proceed by extrusion of the material of the plastics layer 10 around the highly thermally conductive layer 11.

FIG. 4 shows a heat distribution layer 9 which purely by way of example has the structure shown in FIG. 3 with regard to the plastics layer 10 and the highly thermally conductive layer 11. In addition, the heat distribution layer 9 shown in FIG. 4 comprises a transparent barrier layer 12 on one main surface 90 of the heat distribution layer 9. The barrier layer 12 is in particular applied directly to the main surface 90 of the heat distribution layer 9. In the exemplary embodiment shown, this means that the barrier layer 12 is applied directly on the plastics layer 10. In particular, as shown in FIG. 4 the barrier layer 12 may completely cover the main surface of the heat distribution layer 9.

The barrier layer 12 may be formed by one or more layers to form a thin-film encapsulation. Accordingly, the barrier layer 12 may comprise at least one oxide, nitride or oxynitride with one of the materials mentioned above in connection with the encapsulation arrangement 7.

As an alternative to the exemplary embodiment shown in FIG. 4, the plastics layer 10 and the highly thermally conductive layer 11 may also be configured according to the exemplary embodiments of FIGS. 1D and 2 even in the case of an additional barrier layer 12. In the event of use of a heat distribution layer 9 which comprises a barrier layer 12, it may be particularly advantageous for the barrier layer 12 to be arranged on the side of the heat distribution layer 9 facing the organic functional layer stack 3, in order to achieve the best possible barrier action.

In particular, a barrier function may be achieved in the transparent sub-regions 91 of the heat distribution layer 9 by the additional barrier layer 12 even with a non-hermetically impermeable material for the plastics layer 10, which would not be possible if a purely metal layer were used as the heat distribution structure.

The exemplary embodiments described in connection with the figures may moreover alternatively or in addition comprise features described above in the general part.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. Organic light-emitting device, comprising
    an organic functional layer stack with at least one light-emitting layer, which is configured to generate light when the device is in operation,
    a transparent first electrode and a transparent second electrode, which are configured to inject charge carriers into the organic functional layer stack when in operation, and
    a heat distribution layer, which is applied over the electrodes and the organic functional layer stack and which comprises at least one plastics layer and one highly thermally conductive layer, wherein the heat distribution layer comprises at least one transparent sub-region and at least one non-transparent sub-region.

2. Device according to claim 1, wherein the highly thermally conductive layer is formed by a metal layer.

3. Device according to claim 1, wherein the plastics layer and the highly thermally conductive layer are arranged at least in part laterally next to one another in the heat distribution layer.

4. Device according to claim 1, wherein the heat distribution layer is transparent in an edge region and/or in a central region.

5. Device according to claim 1, wherein the highly thermally conductive layer is non-transparent and the plastics layer is transparent.

6. Device according to claim 1, wherein the highly thermally conductive layer comprises a clearance in the at least one transparent sub-region.

7. Device according to claim 1, wherein the highly thermally conductive layer is free of the plastics layer on at least one main surface.

8. Device according to claim 1, wherein the highly thermally conductive layer is free of the plastics layer on both main surfaces.

9. Device according to claim 1, wherein the highly thermally conductive layer is covered on at least one main surface by the plastics layer.

10. Device according to claim 1, wherein the plastics layer completely encloses the highly thermally conductive layer.

11. Device according to claim 1, wherein a transparent encapsulation arrangement is arranged over the electrodes and the functional layer stack, to which encapsulation arrangement the heat distribution layer is applied.

12. Device according to claim 11, wherein the heat distribution layer is applied with a transparent bonding layer to the encapsulation arrangement and the bonding layer is in direct contact with the encapsulation arrangement and the heat distribution layer.

13. Device according to claim 11, wherein the encapsulation arrangement takes the form of a thin-film encapsulation.

14. Device according to claim 1, wherein the heat distribution layer comprises a transparent barrier layer on at least one main surface.

15. Device according to claim 14, wherein the barrier layer is applied at least directly to the plastics layer.

16. Device according to claim 14, wherein the barrier layer completely covers the at least one main surface.

17. Device according to claim 14, wherein the barrier layer is arranged on the side of the heat distribution layer facing the organic functional layer stack.

18. Device according to claim 14, wherein the barrier layer comprises at least one oxide, nitride or oxynitride.

19. Device according to claim 1, wherein the heat distribution layer extends at least in part as far as the edge of the organic light-emitting device.

20. Device according to claim 1, wherein the plastics film contains carbon particles.

\* \* \* \* \*